(12) United States Patent  
Saito

(10) Patent No.: US 11,018,646 B2  
(45) Date of Patent: May 25, 2021

(54) FILTER AND FRONT END CIRCUIT

(71) Applicant: TAIYO YUDEN CO., LTD., Tokyo (JP)

(72) Inventor: Toshiyuki Saito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/798,110

(22) Filed: Feb. 21, 2020

(65) Prior Publication Data

US 2020/0287512 A1  Sep. 10, 2020

(30) Foreign Application Priority Data

Mar. 5, 2019  (JP) .............................. JP2019-039581

(51) Int. Cl.

| H03H 7/01 | (2006.01) |
| H03H 7/46 | (2006.01) |
| H03H 1/00 | (2006.01) |
| H04B 1/40 | (2015.01) |

(52) U.S. Cl.
CPC ............ *H03H 7/0123* (2013.01); *H03H 1/00* (2013.01); *H03H 7/0138* (2013.01); *H03H 7/463* (2013.01); *H04B 1/40* (2013.01); *H03H 2001/0085* (2013.01)

(58) Field of Classification Search
CPC ........ H03H 7/0123; H03H 7/463; H03H 1/00; H03H 1/40; H03H 7/0138; H03H 2001/0085; H03H 7/09; H03H 7/1775; H03H 7/1708; H03H 7/0115; H03H 7/01; H03H 7/075; H03H 7/46

USPC ........................................................ 455/73
See application file for complete search history.

(56) References Cited

U.S. PATENT DOCUMENTS

| 6,521,976 B2 | 2/2003 | Yamaguchi |
| 7,667,557 B2 | 2/2010 | Chen |
| 7,671,706 B2 | 3/2010 | Taniguchi |
| 8,975,983 B2 | 3/2015 | Masuda |
| 9,107,323 B2 | 8/2015 | Tomaki et al. |
| 2003/0043759 A1 | 3/2003 | Yamaguchi |

(Continued)

FOREIGN PATENT DOCUMENTS

| JP | 2002-076807 A | 3/2002 |
| JP | 2008-294603 A | 12/2008 |

(Continued)

*Primary Examiner* — Eugene Yun

(74) *Attorney, Agent, or Firm* — Chen Yoshimura LLP

(57) ABSTRACT

A filter includes: first and second parallel resonant circuits including a first capacitor, a first line, a second capacitor, and a second line that are shunt-connected to a series pathway connecting the input and output terminals; and first to sixth vias penetrating through a second dielectric layer on which the first and second lines are disposed, the first via connecting the first line to the series pathway, the second via connecting the first line to the ground terminal, the third via connecting the first line at a position between the first and second vias to the first connection line at a first position, the fourth via connecting the second line to the series pathway, the fifth via connecting the second line to the ground terminal, the sixth via connecting the second line at a position between the fourth and fifth vias to the first connection line at a second position.

9 Claims, 11 Drawing Sheets

(56) References Cited

U.S. PATENT DOCUMENTS

| | | | |
|---|---|---|---|
| 2007/0297157 A1* | 12/2007 | Tanaka | H01L 23/50 |
| | | | 361/766 |
| 2012/0098622 A1* | 4/2012 | Taniguchi | H03H 7/42 |
| | | | 333/185 |
| 2012/0249264 A1 | 10/2012 | Wakata et al. | |
| 2014/0062616 A1 | 3/2014 | Imamura | |
| 2017/0272047 A1 | 9/2017 | Tanaka et al. | |
| 2018/0013396 A1 | 1/2018 | Tanaka | |

FOREIGN PATENT DOCUMENTS

| | | |
|---|---|---|
| JP | 2012-209767 A | 10/2012 |
| JP | 2014-53689 A | 3/2014 |
| WO | 2016/92903 A1 | 6/2016 |
| WO | 2016/157928 A1 | 10/2016 |

* cited by examiner

FILTER AND FRONT END CIRCUIT

CROSS-REFERENCE TO RELATED APPLICATION

This application is based upon and claims the benefit of priority of the prior Japanese Patent Application No. 2019-039581, filed on Mar. 5, 2019, the entire contents of which are incorporated herein by reference.

FIELD

A certain aspect of the present invention relates to a filter and a front end circuit.

BACKGROUND

Filters removing unnecessary interfering waves are used in wireless communication terminals such as smartphones and mobile phones. It has been known to use, as a filter, a multilayered body formed of stacked dielectric layers. There has been known a filter including an LC parallel resonant circuit having an inductor and a capacitor as disclosed in Japanese Patent Application Publication Nos. 2012-209767 and 2014-53689 and International Publication No. 2016/92903.

SUMMARY OF THE INVENTION

According to a first aspect of the embodiments, there is provided a filter including: an input terminal; an output terminal; a ground terminal; a first parallel resonant circuit including a first capacitor and a first line, each of the first capacitor and the first line being shunt-connected to a first node of a series pathway connecting the input terminal and the output terminal; a second parallel resonant circuit including a second capacitor and a second line, each of the second capacitor and the second line being shunt-connected to a second node of the series pathway, the second node being different from the first node; a first dielectric layer having a surface on which a first connection line is disposed; and a second dielectric layer having a surface on which the first line and the second line are disposed, the second dielectric layer being arranged on or above the first dielectric layer and having first, second, third, fourth, fifth, and sixth via wirings that are penetrating through the second dielectric layer, the first via wiring electrically connecting the first line to the series pathway, the second via wiring electrically connecting the first line to the ground terminal, the third via wiring connecting the first line at a position between the first via wiring and the second via wiring to the first connection line at a first position of the first connection line, the fourth via wiring electrically connecting the second line to the series pathway, the fifth via wiring electrically connecting the second line to the ground terminal, the sixth via wiring connecting the second line at a position between the fourth via wiring and the fifth via wiring to the first connection line at a second position of the first connection line different from the first position of the first connection line.

According to a second aspect of the embodiments, there is provided a front end circuit including: an antenna terminal; a high-pass filter, a low-pass filter, and a bandpass filter that are connected to the antenna terminal; and a multiplexer to be connected to the high-pass filter, the low-pass filter, or the bandpass filter, the multiplexer including a receive filter and a transmit filter, wherein at least one of the band-pass filter, the receive filter, and the transmit filter being the above filter.

DETAILED DESCRIPTION

In the filter having an LC parallel resonant circuit, functions as a filter are achieved by forming the attenuation pole by the resonant frequency. However, the characteristics may change due to the shift of the dielectric layers.

Hereinafter, a description will be given of embodiments with reference to the accompanying drawings.

First Embodiment

Figure 1:
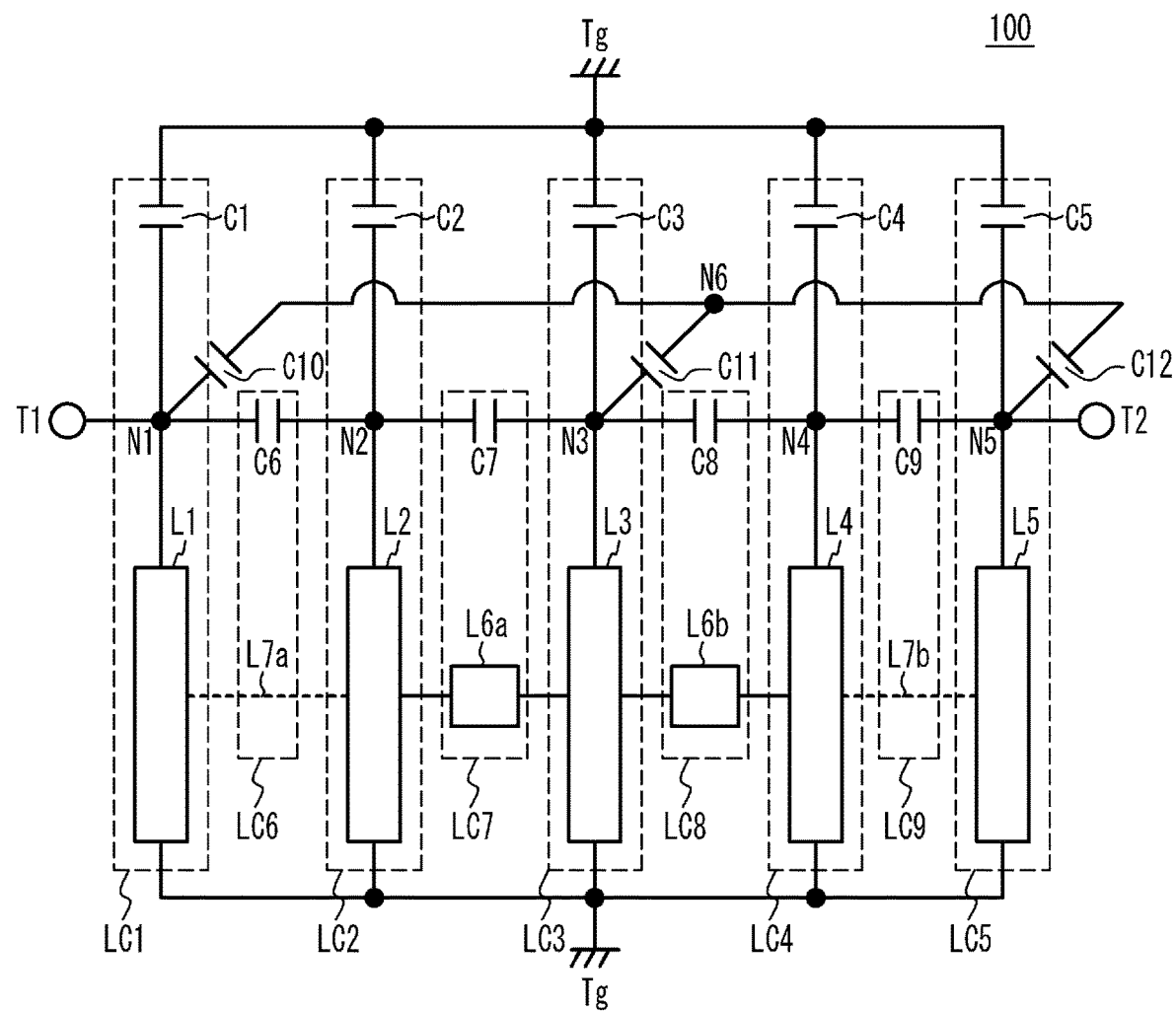
FIG. 1 is a circuit diagram of a filter in accordance with a first embodiment.

A first embodiment is an exemplary bandpass filter (BPF). FIG. 1 is a circuit diagram of a filter in accordance with the first embodiment. As illustrated in FIG. 1, a filter 100 includes an input terminal T1, an output terminal T2, ground terminals Tg, capacitors C1 to C12, and striplines L1 to L5, L6a, and L6b.

The capacitors C1 to C5 are respectively shunt-connected to nodes N1 to N5 in a series pathway between the terminals T1 and T2. The striplines L1 to L5 are respectively shunt-connected to the nodes N1 to N5 in the series pathway between the terminals T1 and T2. The capacitor C1 and an inductor formed of the stripline L1 are connected in parallel to form an LC parallel resonant circuit LC1. Similarly, the capacitors C2 to C5 and inductors formed of the striplines L2 to L5 are connected in parallel to form LC parallel resonant circuits LC2 to LC5, respectively. The LC parallel resonant circuits LC1 to LC5 are respectively shunt-connected to the nodes N1 to N5 in the series pathway.

The capacitors C6 to C9 are located in the series pathway between the terminals T1 and T2. The capacitor C6 is connected between the nodes N1 and N2, the capacitor C7 is connected between the nodes N2 and N3, the capacitor C8 is connected between the nodes N3 and N4, and the capacitor C9 is connected between the nodes N4 and N5. The capacitors C10 and C12 are connected in series between the nodes N1 and N5, and are connected in parallel to the capacitors C6 to C9. The capacitor C11 is connected between a node N6, which is located between the capacitors C10 and C12, and the node N3. The stripline L6a is connected between the striplines L2 and L3, and the stripline L6b is connected between the striplines L3 and L4.

In the transmission characteristics between the input terminal T1 and the output terminal T2, the parallel resonant circuits LC1 to LC5 form the passband by the resonant frequencies. The striplines L1 and L2 are magnetically coupled as indicated by L7a, and the striplines L4 and L5 are magnetically coupled as indicated by L7b. A parallel resonant circuit LC6 formed of the magnetic field coupling L7a and the capacitor C6 and a parallel resonant circuit LC9 formed of the magnetic field coupling L7b and the capacitor C9 form attenuation poles by the resonant frequencies at frequencies lower than the passband. A parallel resonant circuit LC7 formed of the stripline L6a and the capacitor C7 and a parallel resonant circuit LC8 formed of the stripline L6b and the capacitor C8 form attenuation poles by the resonant frequencies at frequencies higher than the passband. The capacitors C10 to C12 make the frequencies of the attenuation poles formed by the parallel resonant circuits LC6 and LC9 different, and make the frequencies of the attenuation poles formed by the parallel resonant circuits LC7 and LC8 different. Accordingly, the filter 100 functions as a bandpass filter.

Figure 2:
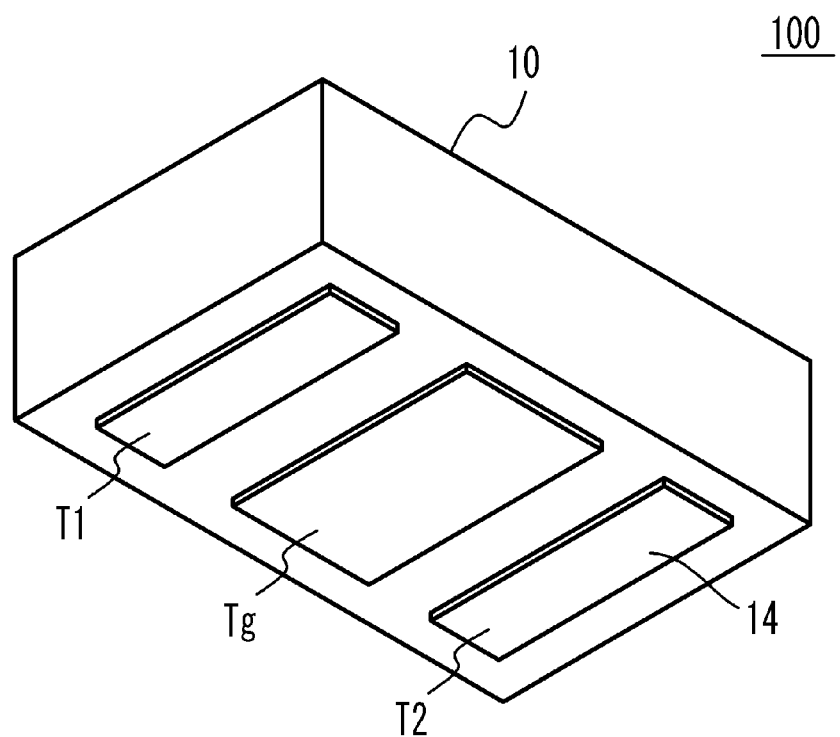
FIG. 2 is a perspective view of the filter in accordance with the first embodiment.

FIG. 2 is a perspective view of the filter in accordance with the first embodiment. As illustrated in FIG. 2, the filter 100 includes a multilayered body 10. Terminals 14 are located on the lower surface of the multilayered body 10. The terminals 14 include, for example, the terminals T1 and T2 and the ground terminals Tg.

Figure 3:
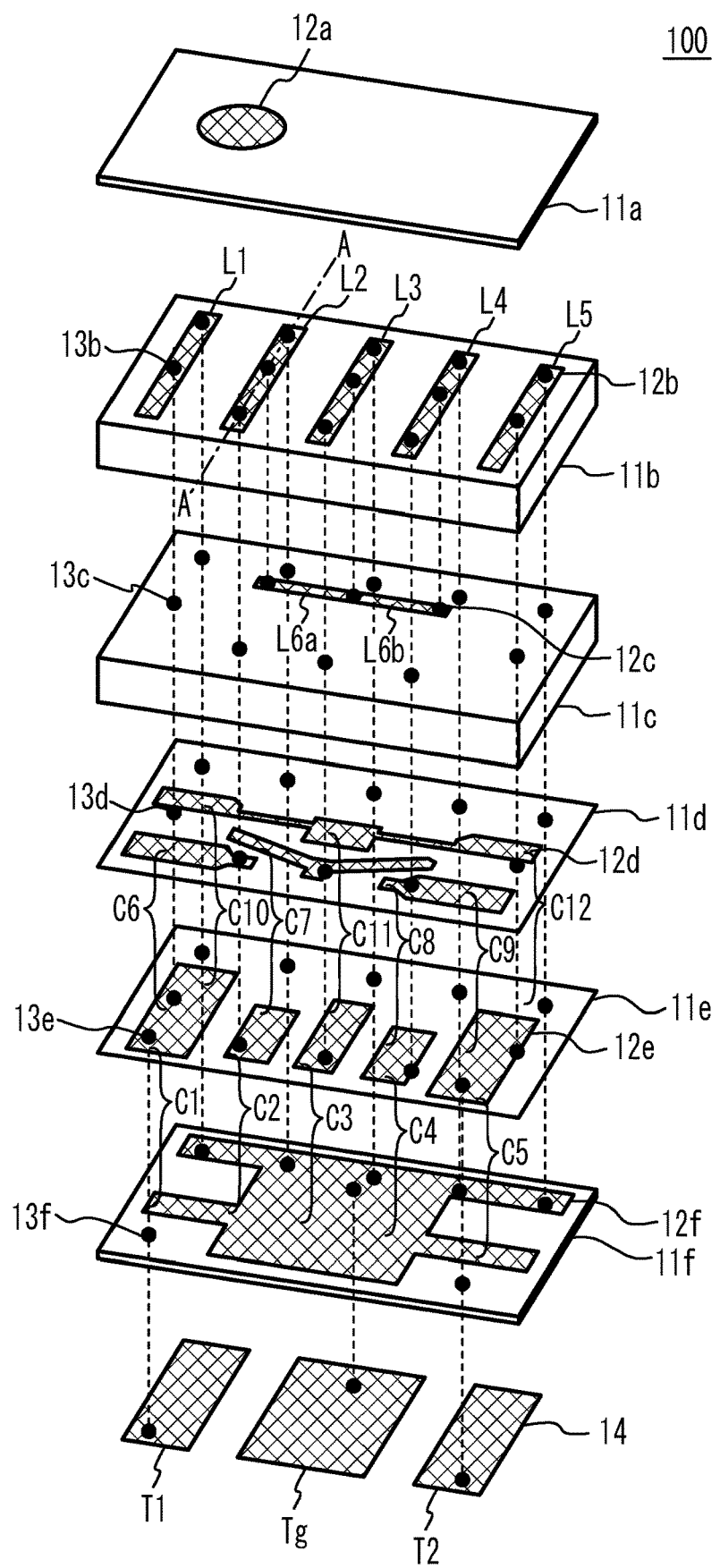
FIG. 3 is an exploded perspective view of the filter in accordance with the first embodiment.
Figure 4:
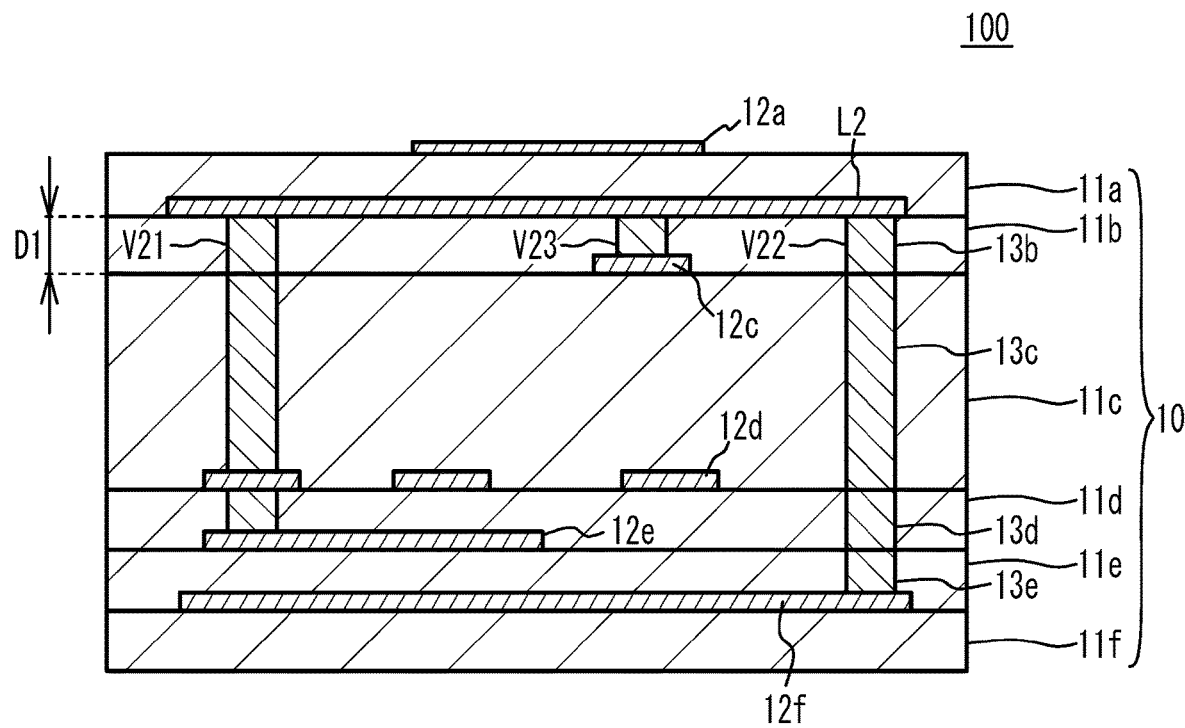
FIG. 4 is a cross-sectional view of the filter in accordance with the first embodiment, and is a cross-sectional view taken along line A-A in FIG. 3.

FIG. 3 is an exploded perspective view of the filter in accordance with the first embodiment. In FIG. 3, the connections of via wirings 13b to 13f are indicated by dashed lines. FIG. 4 is a cross-sectional view of the filter in accordance with the first embodiment, and is a cross-sectional view taken along line A-A in FIG. 3. As illustrated in FIG. 3 and FIG. 4, in the multilayered body 10, dielectric layers 11a to 11f made of a ceramic material are stacked. Conductive patterns 12a to 12f are respectively located on the upper surfaces of the dielectric layers 11a to 11f. The terminals 14 are located on the lower surface of the dielectric layer 11f. The via wirings 13b to 13f are provided so as to respectively penetrate through the dielectric layers 11b to 11f. Each of the via wirings 13b to 13e is coupled to at least one of the conductive patterns 12b to 12f. The via wiring 13f connects at least one of the conductive patterns 12b to 12f to the terminal 14.

The conductive pattern 12a functions as an orientation identification mark. The striplines L1 to L5 are formed of the conductive patterns 12b. The striplines L6a and L6b are formed of the conductive pattern 12c. The capacitors C6 to C12 are formed of the conductive patterns 12d and 12e sandwiching the dielectric layer 11d therebetween. The capacitors C1 to C5 are formed of the conductive patterns 12e and 12f sandwiching the dielectric layer 11e therebetween.

Figure 5:
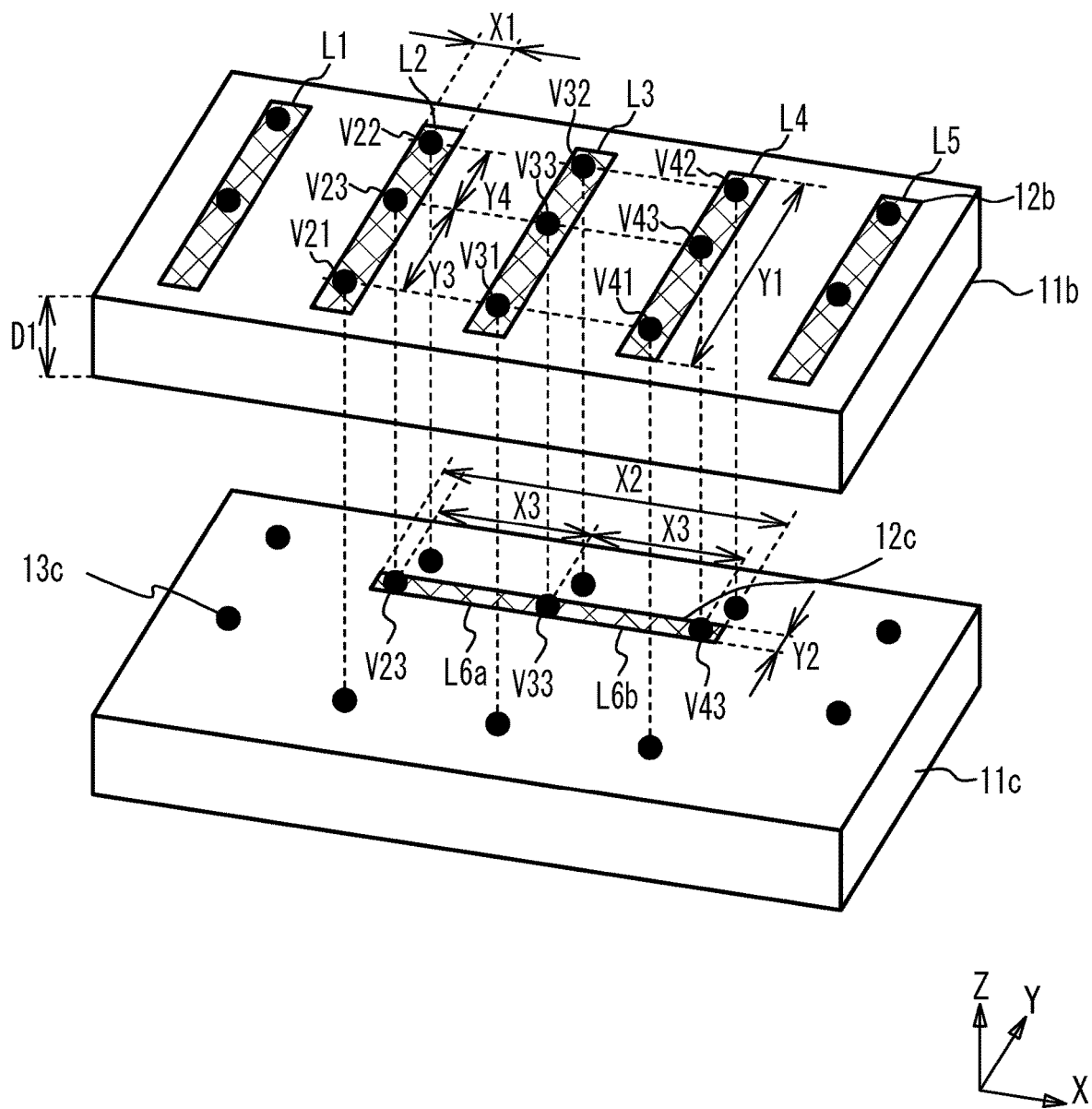
FIG. 5 is an exploded perspective view in which dielectric layers 11b and 11c are enlarged in the first embodiment.

FIG. 5 is an exploded perspective view in which the dielectric layers 11b and 11c are enlarged in the first embodiment. The direction in which the striplines L1 to L5 are arranged (the arrangement direction) is defined as an X direction, the direction in which the striplines L1 to L5 extend (the extension direction) is defined as a Y direction, and the direction in which the dielectric layers 11b and 11c are stacked (the stacking direction) is defined as a Z direction.

As illustrated in FIG. 5, via wirings V21, V31, and V41 are respectively electrically connected to first ends of the striplines L2 to L4. The via wirings V21, V31, and V41 are electrically connected to the conductive patterns 12e corresponding to the electrodes of the capacitors C2 to C4, respectively (see FIG. 3 and FIG. 4). Via wirings V22, V32, and V42 are respectively electrically connected to second ends of the striplines L2 to L4. The via wirings V22, V32, and V42 are electrically connected to the conductive pattern 12f to which a ground potential is supplied from the ground terminal Tg (see FIG. 3 and FIG. 4).

A via wiring V23 is connected between the via wirings V21 and V22 of the stripline L2, a via wiring V33 is connected between the via wirings V31 and V32 of the stripline L3, and a via wiring V43 is connected between the via wirings V41 and V42 of the stripline L4. The via wirings V23, V33, and V43 are electrically connected to the striplines L6a and L6b. The part between the via wirings V23 and V33 of the conductive pattern 12c corresponds to the stripline L6a, and the part between the via wirings V33 and V43 of the conductive pattern 12c corresponds to the stripline L6b.

The widths in the X direction of the striplines L2 to L4 are configured to be X1, and the widths in the Y direction of the striplines L2 to L4 are configured to be Y1. The distance between the centers of the via wirings V21 and V23, the distance between the centers of the via wirings V31 and V33, and the distance between the centers of the via wirings V41 and V43 are configured to be substantially equal to each other and are configured to be Y3. The distance between the centers of the via wirings V23 and V22, the distance between the centers of the via wirings V33 and V32, and the distance between the centers of the via wirings V43 and V42 are configured to be substantially equal to each other and are configured to be Y4. The width in the X direction of the striplines L6a and L6b is configured to be X2, and the widths in the Y direction of the striplines L6a and L6b are configured to be Y2. The distance between the centers of the via wirings V23 and V33 and the distance between the centers of the via wirings V33 and V43 are configured to be substantially equal to each other and are configured to be X3. The thickness of the dielectric layer 11b is D1.

The dielectric layers 11a to 11f are made of a ceramic material, and contain, for example, an oxide of Si, Ca, and Mg (for example, $CaMgSi_2O_6$ that is a diopside crystal) as a main component. The main component of the dielectric layers 11a to 11f may be an oxide of an element other than Si, Ca, and/or Mg. Furthermore, the dielectric layers 11a to 11f may contain, as an insulating material, an oxide of at least one of Ti, Zr, and Al.

The conductive patterns 12a to 12f, the via wirings 13b to 13f, and the upper part of the terminal 14 are formed of metal layers mainly composed of, for example, Ag, Pd, Pt, Cu, Ni, Au, an Au—Pd alloy, or an Ag—Pt alloy. The upper part of the terminal 14 may contain a non-conductive material such as, but not limited to, $TiO_2$, $ZrO_2$, or $Al_2O_3$ in addition to the above metal material. The lower part of the terminal 14 is formed of a Ni film and a Sn film.

The multilayered body 10 is manufactured as follows, for example. The dielectric layers 11a to 11f are fabricated by, for example, doctor blading. The via wirings 13b to 13f respectively penetrating through the dielectric layers 11b to 11f are formed. For example, via holes penetrating through the dielectric layers 11a to 11f are formed by laser beam irradiation. The via wirings 13*b* to 13*f* are formed in the via holes by, for example, squeegeeing. The conductive patterns 12*a* to 12*f* and the upper part of the terminal 14 are formed on the surfaces of the dielectric layers 11*a* to 11*f*. The conductive patterns 12*a* to 12*f* and the upper part of the terminal 14 are formed by, for example, screen printing or transfer printing. The dielectric layers 11*a* to 11*f* are stacked to form the multilayered body 10. The dielectric layers 11*a* to 11*f* are stacked by, for example, heating and pressurizing or an adhesive agent. The multilayered body 10 is fired at, for example, 700° C. or greater. This process causes the dielectric layers 11*a* to 11*f* to be a sintered body. The lower part of the terminal 14 is formed under the upper part of the terminal 14. The lower part of the terminal 14 is formed by, for example, plating such as, but not limited to, barrel plating.

First Comparative Example

Figure 6:
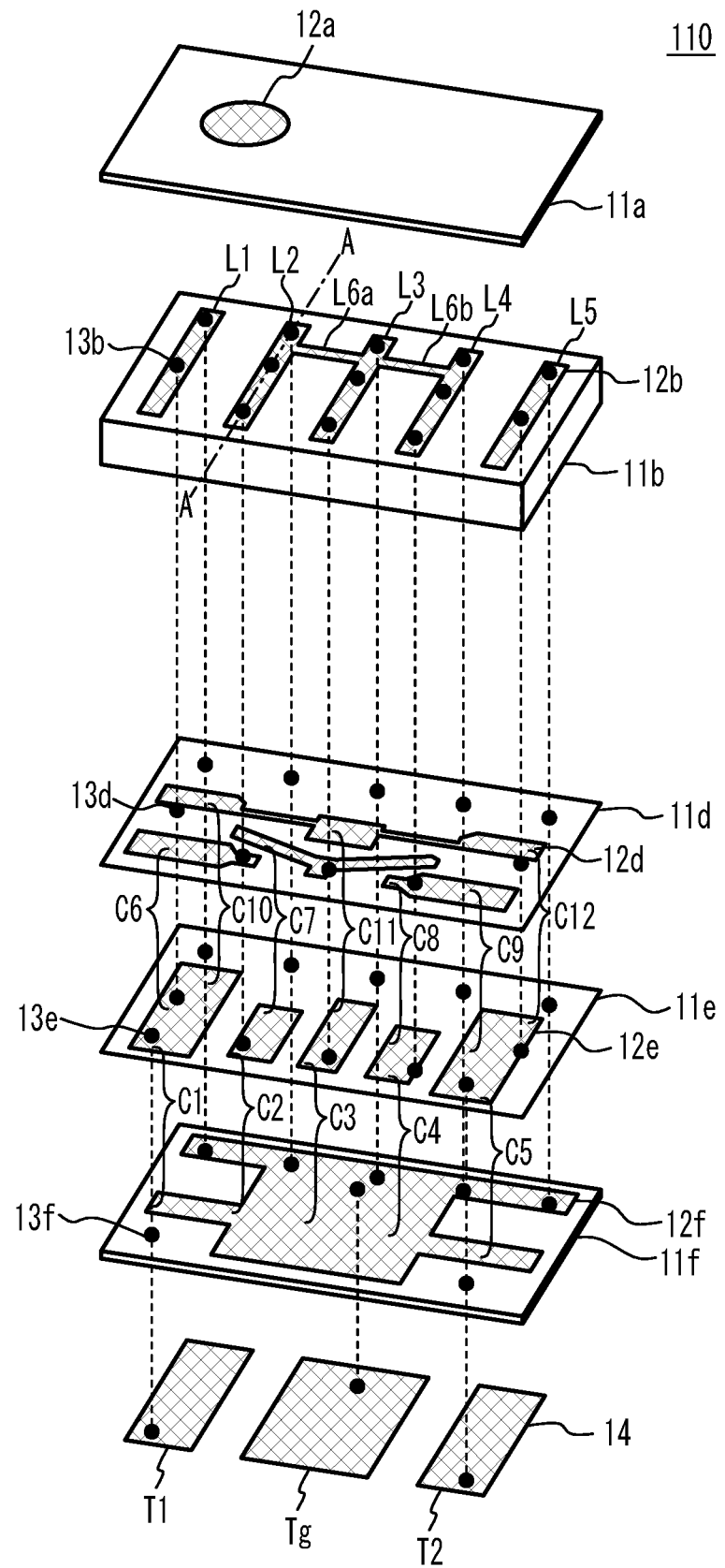
FIG. 6 is an exploded perspective view of a filter in accordance with a first comparative example.

FIG. 6 is an exploded perspective view of a filter in accordance with a first comparative example. As illustrated in FIG. 6, in a filter 110 in accordance with the first comparative example, the dielectric layer 11*c* is not provided, and the striplines L6*a* and L6*b* are formed of the conductive patterns 12*b*. Other structures are the same as those of the first embodiment.

Figure 7A:
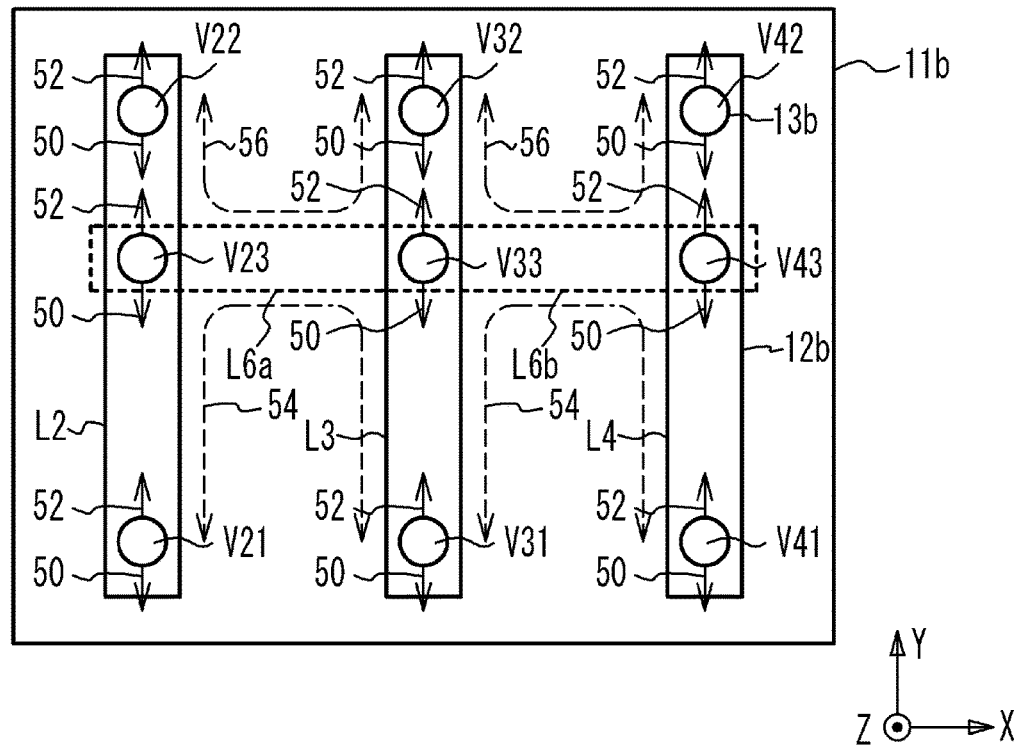
FIG. 7A and FIG. 7B are plan views of striplines L2 to L4 in the first embodiment and the first comparative example, respectively.
Figure 7B:
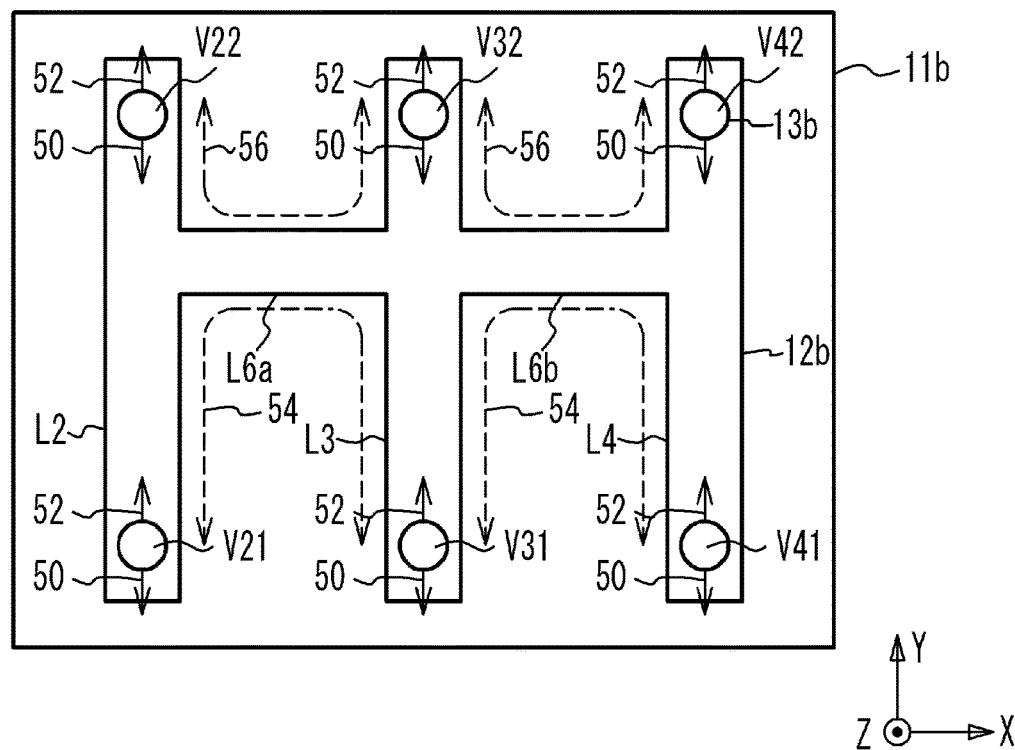

FIG. 7A and FIG. 7B are plan views of the striplines L2 to L4 in the first embodiment and the first comparative example, respectively. As illustrated in FIG. 7A, in the first embodiment, the striplines L2 to L4 are located on the dielectric layer 11*b*. As illustrated in FIG. 7B, in the first comparative example, the stripline L6*a* is coupled to the striplines L2 and L3 on the dielectric layer 11*b*. The stripline L6*b* is coupled to the striplines L3 and L4 on the dielectric layer 11*b*. Thus, in the first comparative example, no via wirings V23, V33, and V43 are provided.

Simulation

The transmission characteristics of the filters of the first comparative example and the first embodiment were simulated. The simulation conditions are as follows. Table 1 presents the approximate values of the capacitances of the capacitors C1 to C12.

TABLE 1

| Capacitor | Capacitance [pF] |
|---|---|
| C1 | 0.8 |
| C2 | 1.3 |
| C3 | 1.6 |
| C4 | 1.3 |
| C5 | 0.8 |
| C6 | 0.9 |
| C7 | 0.06 |
| C8 | 0.06 |
| C9 | 0.9 |
| C10 | 0.12 |
| C11 | 0.5 |
| C12 | 0.12 |

Table 2 presents the approximate values of the inductances of the striplines L1 to L5, L6*a*, and L6*b*.

TABLE 2

| Stripline | Inductance [nH] |
|---|---|
| L1 | 0.76 |
| L2 | 0.68 |
| L3 | 0.63 |
| L4 | 0.68 |
| L5 | 0.76 |
| L6a | 0.18 |
| L6b | 0.18 |

Table 3 presents the dimensions of the striplines L1 to L5, L6*a*, and L6*b*.

TABLE 3

| | Distance [μm] |
|---|---|
| X1 | 110 |
| X2 | 900 |
| X3 | 412.5 |
| Y1 | 1000 |
| Y2 | 75 |
| Y3 | 625 |
| Y4 | 175 |

In the first comparative example, Y3 corresponds to the distances in the Y direction between each of the centers of the via wirings V21, V31, and V41 and the centers of the striplines L6*a* and L6*b*, and Y4 corresponds to the distances in the Y direction between each of the centers of the via wirings V22, V32, and V42 and the centers of the striplines L6*a* and L6*b*. X3 corresponds to the distance in the X direction between the centers of the striplines L2 and L3 and the distance in the X direction between the centers of the striplines L3 and L4.

As illustrated in FIG. 7B, simulated were the case where the via wirings 13*b* (i.e., the via wirings V21, V22, V31, V32, V41, and V42) are shifted with respect to the conductive patterns 12*b* (i.e., the striplines L2 to L4) by 40 μm in the positive Y direction as indicated by arrows 52, the case where the via wirings 13*b* are shifted with respect to the conductive patterns 12*b* by 40 μm in the negative Y direction as indicated by arrows 50, and the case where the via wirings 13*b* are not shifted.

Figure 8A:
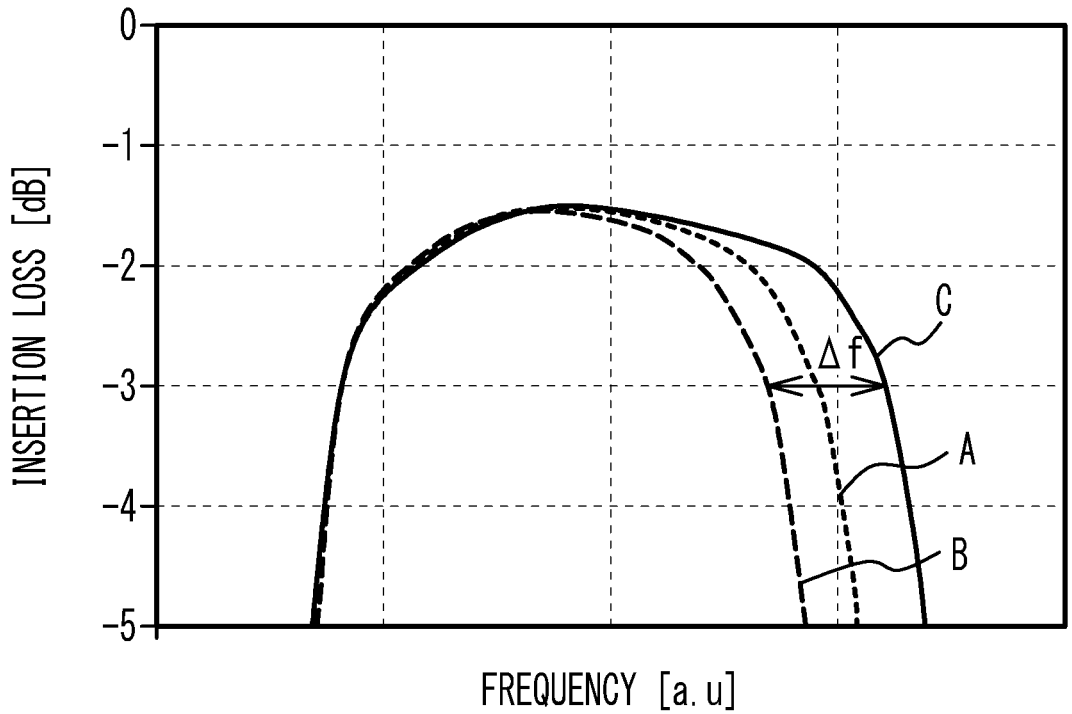
FIG. 8A and FIG. 8B illustrate transmission characteristics in the first comparative example.
Figure 8B:
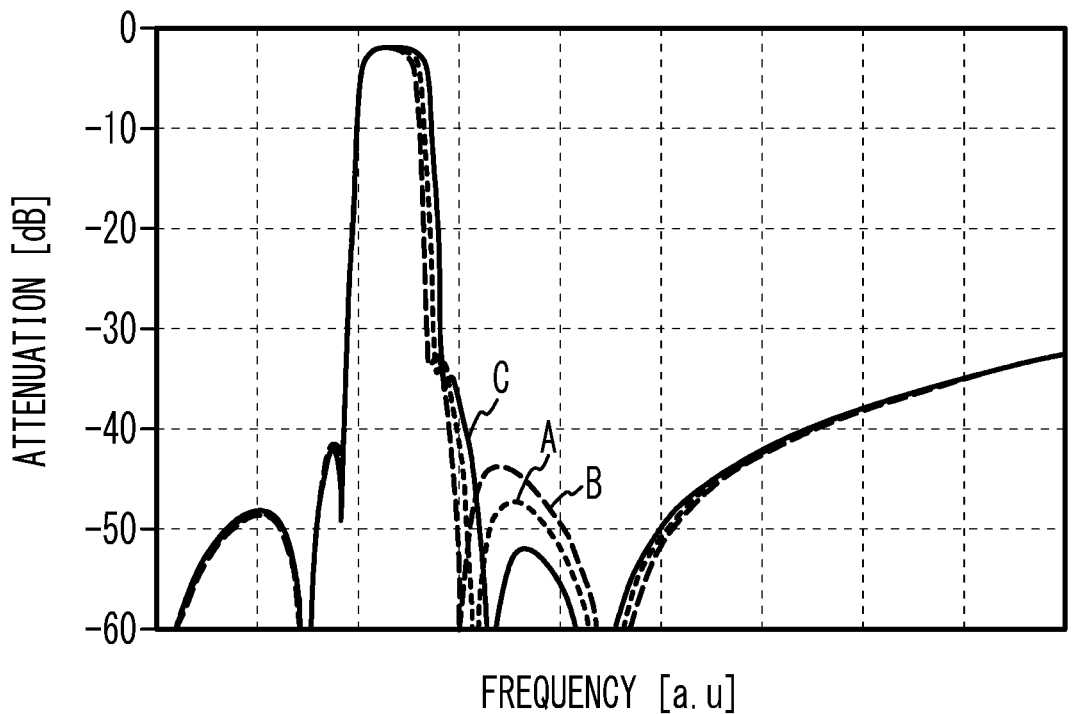

FIG. 8A and FIG. 8B illustrate transmission characteristics in the first comparative example. FIG. 8A illustrates the insertion loss around the passband, and FIG. 8B illustrates the attenuation characteristic in the wide band. The horizontal axis is presented by an arbitrary unit [a.u.]. A filter A corresponds to the case where the via wirings 13*b* are not shifted with respect to the conductive patterns 12*b*, a filter B and a filter C correspond to the cases where the via wirings 13*b* are shifted with respect to the conductive patterns 12*b* by ±40 μm.

As illustrated in FIG. 8A, when the via wirings 13*b* are shifted with respect to the conductive patterns 12*b*, the width of the passband changes. As illustrated in FIG. 8B, the attenuation at frequencies higher than the passband changes. In FIG. 8A, when the value obtained by dividing the difference in the frequency of the passband at an insertion loss of 3 dB between the filters B and C by the frequency of the passband at an insertion loss of 3 dB of the filter A is defined as a frequency variation Δf, Δf is approximately 5.0%.

When the via wirings 13*b* shift with respect to the conductive patterns 12*b* as indicated by the arrows 50 as illustrated in FIG. 7B, a distance 54 from the via wiring V21 to the via wiring V31 through the striplines L2, L6*a*, and L3 increases. On the other hand, a distance 56 from the via wiring V22 to the via wiring V32 through the striplines L2, L6a, and L3 decreases. When the via wirings 13b shift with respect to the conductive patterns 12b as indicated by the arrows 52, the distance 54 decreases, and the distance 56 increases. This is considered as the reason why the frequency of the attenuation pole formed at a frequency higher than the passband changes, and the frequency variation Δf increases.

Figure 9A:
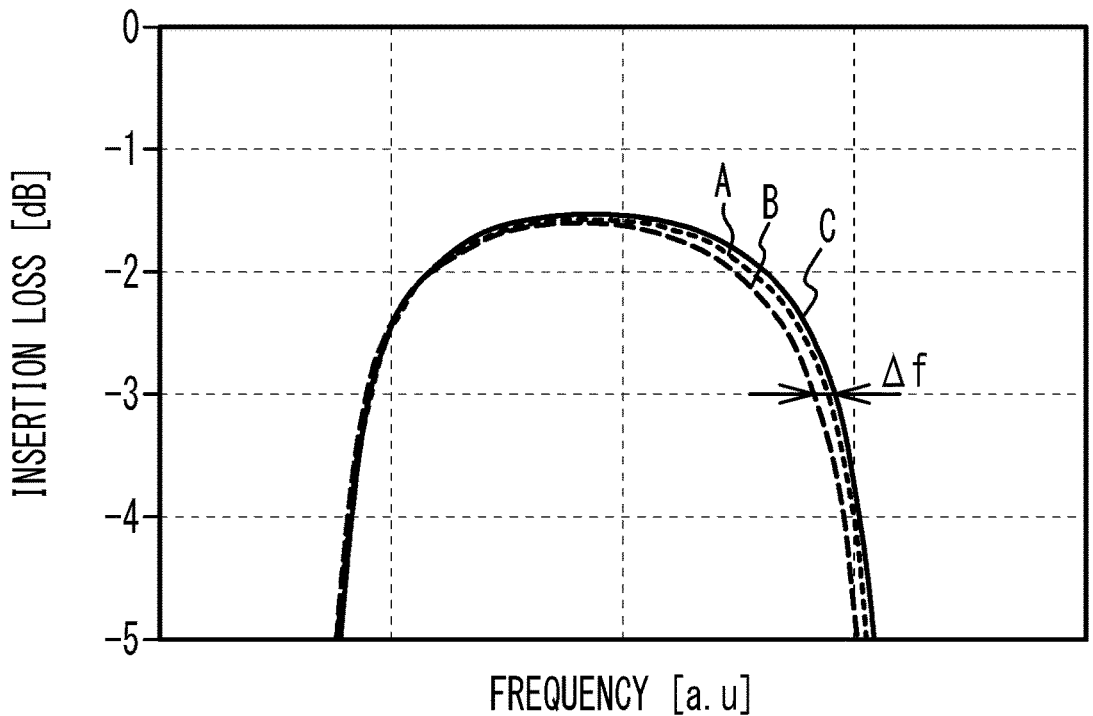
FIG. 9A and FIG. 9B illustrate transmission characteristics in the first embodiment.
Figure 9B:
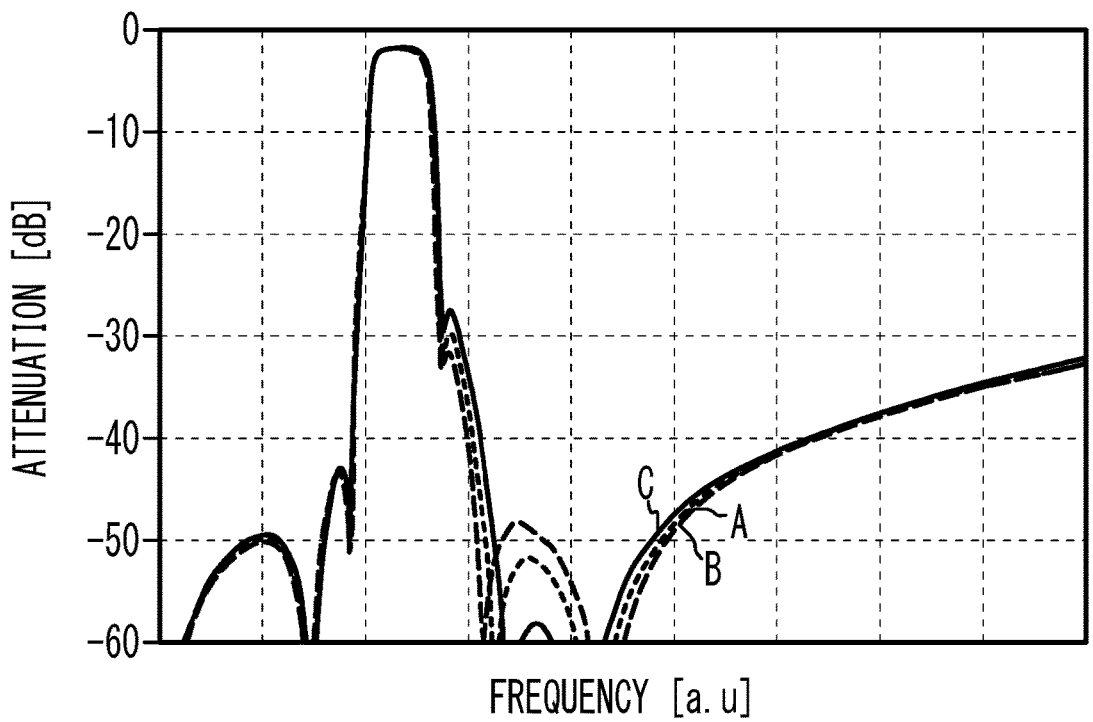

FIG. 9A and FIG. 9B illustrate transmission characteristics in the first embodiment. FIG. 9A illustrates the insertion loss around the passband, and FIG. 9B illustrates the attenuation characteristic in the wide band. The horizontal axis is presented by an arbitrary unit [a.u.]. The thickness D1 of the dielectric layer 11b was assumed to be 200 μm. The filter A corresponds to the case where the via wirings 13b are not shifted with respect to the conductive patterns 12b, and the filter B and the filter C correspond to the cases where the via wirings 13b are shifted with respect to the conductive patterns 12b by ±40 μm.

As illustrated in FIG. 9A, even when the via wirings 13b are shifted with respect to the conductive patterns 12b, the change in the width of the passband is small. As illustrated in FIG. 9B, the attenuation at frequencies higher than the passband changes. In FIG. 9A, the frequency variation Δf at an insertion loss of 3 dB is approximately 0.8%. As seen above, in the first embodiment, Δf is small.

As illustrated in FIG. 7A, in the first embodiment, even when the via wirings 13b shift with respect to the conductive patterns 12b in the direction indicated by the arrow 50 or 52, the via wirings V23 (V33 and V43) shift while keeping the distances to the via wirings V21 (V31 and V41) and the distances to the via wirings V22 (V32 and V42) the same as those before shift. Thus, the distances 54 and 56 hardly change. Therefore, the frequency variation Δf can be decreased.

Figure 10:
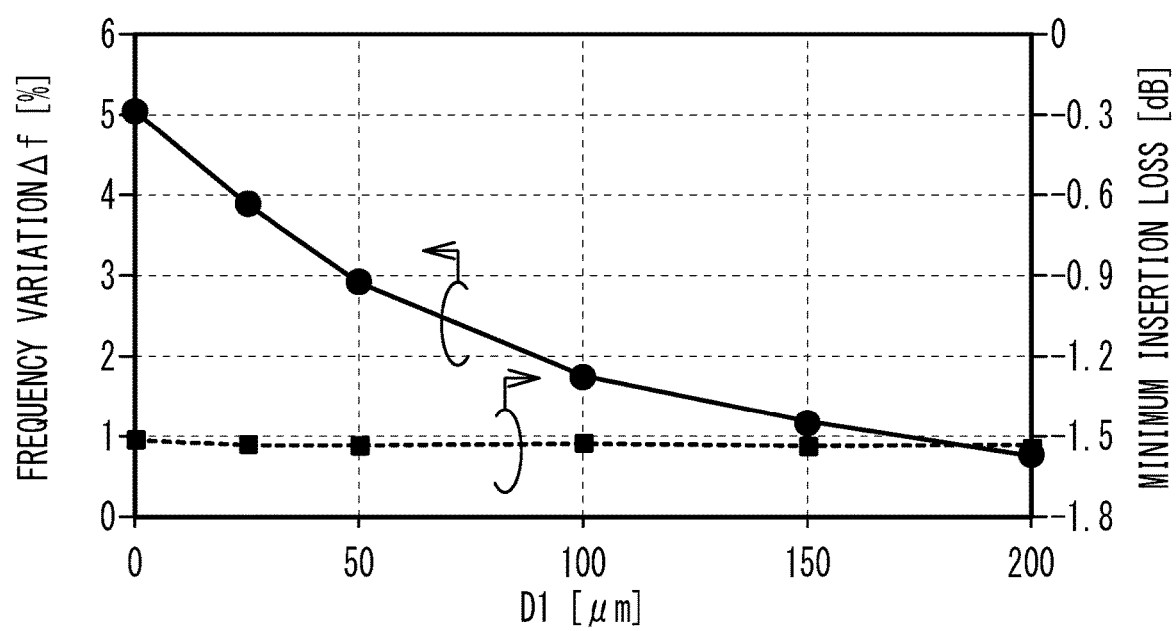
FIG. 10 is a graph of frequency variation Δf and minimum insertion loss versus thickness D1 in the first embodiment.

FIG. 10 is a graph of the frequency variation Δf and the minimum insertion loss versus the thickness D1 in the first embodiment. The minimum insertion loss is the smallest insertion loss in the passband. In FIG. 10, dots represent the simulated thicknesses, and the straight line connects the dots. The case of D1=0 corresponds to the first comparative example.

As illustrated in FIG. 10, as the thickness D1 increases, the frequency variation Δf decreases. The minimum insertion loss are substantially the same regardless of D1. As seen above, as the dielectric layer 11b is thickened, the frequency variation Δf is decreased without changing the insertion loss. The reason why the frequency variation Δf increases as D1 decreases is considered because the magnetic field coupling between the striplines L2 to L4 and the striplines L6a and L6b is enhanced.

When D1 is configured to be 25 μm or greater, Δf is made to be equal to or less than 80% of that of the first comparative example. When D1 is configured to be 50 μm or greater, Δf is made to be equal to or less than 60% of that of the first comparative example. When D1 is configured to be 100 μm or greater, Δf is made to be equal to or less than 40% of that of the first comparative example. When D1 is configured to be 200 μm or greater, Δf is made to be equal to or less than 20% of that of the first comparative example. To reduce the size of the filter, D1 is preferably 1000 μm or less.

In the first embodiment, the parallel resonant circuit LC2 (a first parallel resonant circuit) includes the capacitor C2 (a first capacitor) and the stripline L2 (a first line), and each of the capacitor C2 and the stripline L2 is shunt-connected to the node N2 (a first node) of the series pathway connecting the input terminal T1 and the output terminal T2. The parallel resonant circuit LC3 (a second parallel resonant circuit) includes the capacitor C3 (a second capacitor) and the stripline L3 (a second line), and each of the capacitor C3 and the stripline L3 are shunt-connected to the node N3 (a second node), which is different from the node N2, of the series pathway.

The stripline L6a (a first connection line) is located on the surface of the dielectric layer 11c (a first dielectric layer). The striplines L2 and L3 are located on the surface of the dielectric layer 11b (a second dielectric layer). The via wirings V21, V22, V23, V31, V32, and V33 penetrate through the dielectric layer 11b. The via wiring V21 (a first via wiring) electrically connects the stripline L2 to the series pathway, and the via wiring V31 (a fourth via wiring) electrically connects the stripline L3 to the series pathway. The via wiring V22 (a second via wiring) electrically connects the stripline L2 to the ground terminal Tg, and the via wiring V32 (a fifth via wiring) electrically connects the stripline L3 to the ground terminal Tg. The via wiring V23 (a third via wiring) connects the stripline L2 at a position between the via wirings V21 and V22 to the stripline L6a at a first position of the stripline L6a. The via wiring V33 (a sixth via wiring) connects the stripline L3 at a position between the via wirings V31 and V32 to the stripline L6a at a second position, which is different from the first position, of the stripline L6a.

This structure makes the frequency variation Δf small as illustrated in FIG. 10 even when the via wirings 13b shift with respect to the conductive patterns 12b in the positive/negative Y direction as indicated by the arrows 50 and 52 in FIG. 7A. Therefore, the change in filter characteristics is reduced.

A first end of the capacitor C7 (a third capacitor) is connected to the node N2, and a second end of the capacitor C7 is connected to the node N3. This structure allows the attenuation pole to be formed by the capacitor C7 and the stripline L6a.

The parallel resonant circuits LC2 and LC3 form the passband, and the capacitor C7 and the stripline L6a form the stopband. Therefore, a filter is formed.

The striplines L2 and L3 extend in substantially the same direction on the surface of the dielectric layer 11b. The via wirings V21 and V31 are located at the same side (the negative Y side) with respect to the via wirings V23 and V33 on the surface of the dielectric layer 11b. In this case, when the via wirings 13b shift with respect to the conductive patterns 12b in the positive/negative Y direction, the frequency variation Δf tends to increase. Thus, the stripline L6a is preferably located on the dielectric layer 11c different from the dielectric layer 11b.

The parallel resonant circuit LC4 (a third parallel resonant circuit) includes the capacitor C4 (a fourth capacitor) and the stripline L4 (a third line), and each of the capacitor C4 and the stripline L4 is shunt-connected to the node N4 (a third node), which is different from the nodes N2 and N3, of the series pathway. The stripline L6b (a second connection line) is located on the surface of the dielectric layer 11c, and the stripline L4 is located on the surface of the dielectric layer 11b. The via wirings V41, V42, and V43 penetrate through the dielectric layer 11b. The via wiring V41 (a seventh via wiring) electrically connects the stripline L4 to the series pathway. The via wiring V42 (an eighth via wiring) electrically connects the stripline L4 to the ground terminal Tg. The via wiring V43 (a ninth via wiring) connects the stripline L4 at a position between the via wirings V41 and V42 to the stripline L6b at a first position of the stripline L6b. The via wiring V33 connects to the stripline L6b at a second position, which is different from the first position, of the stripline L6b. This structure widens the passband and the stopband.

The striplines L2 and L3 are located 50 µm or greater away from the stripline L6a in the thickness direction of the dielectric layer 11b. This structure makes the frequency variation Δf small as illustrated in FIG. 10.

The multilayered body 10 includes a plurality of the dielectric layers 11a to 11f that are stacked, and the input terminal T1, the output terminal T2, and the ground terminal Tg are located on the surface of the multilayered body 10. Therefore, a filter can be formed of the multilayered body.

Second Embodiment

Figure 11:
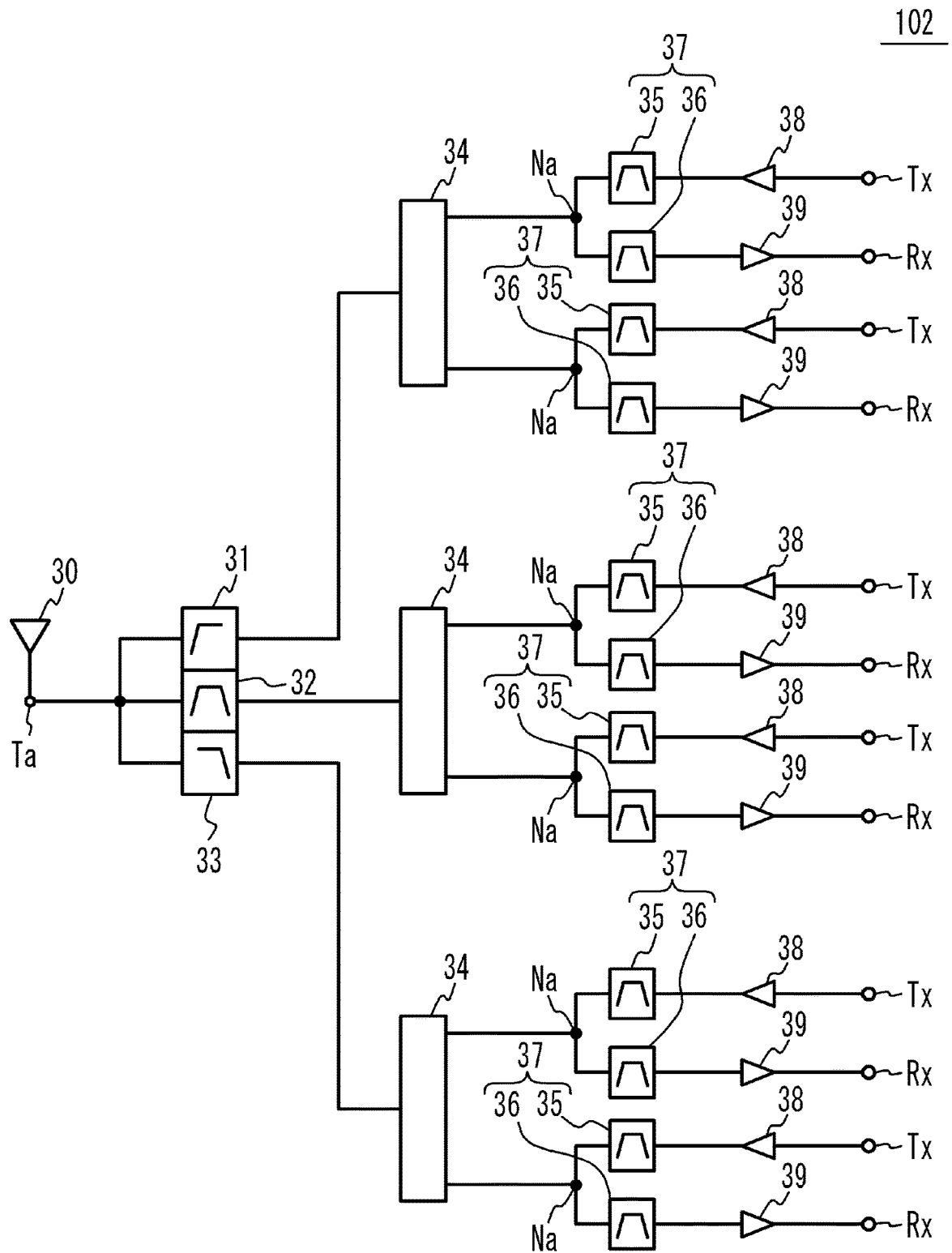
FIG. 11 is a circuit diagram of a front end circuit in accordance with a second embodiment.

A second embodiment is an exemplary circuit in which the filter of the first embodiment is used. FIG. 11 is a circuit diagram of a front end circuit in accordance with the second embodiment. As illustrated in FIG. 11, a front end circuit 102 includes a high-pass filter (HPF) 31, a bandpass filter (BPF) 32, a low-pass filter (LPF) 33, switches 34, duplexers 37, power amplifiers (PAs) 38, and low noise amplifiers (LNAs) 39.

An antenna 30 is coupled to an antenna terminal Ta. First ends of the HPF 31, the BPF 32, and the LPF 33 are commonly connected to the antenna terminal Ta. The switches 34 are coupled to second ends of the HPF 31, the BPF 32, and the LPF 33. The HPF 31 allows high-frequency signal in a high band to pass therethrough, and suppresses signals with other frequencies. The BPF 32 allows high-frequency signal in a middle band of which the frequency is lower than that of the high band to pass therethrough, and suppresses signals with other frequencies. The LPF 33 allows high-frequency signal in a low band of which the frequency is lower than that of the middle band to pass therethrough, and suppresses signals with other frequencies.

Common terminals Na of the duplexers 37 are coupled to the switch 34. The switch 34 selects one duplexer 37 from among the duplexers 37, and connects the selected duplexer 37 to the corresponding one of the second ends of the HPF 31, the BPF 32, and the LPF 33. The duplexer 37 includes a transmit filter 35, which is a BPF, and a receive filter 36, which is a BPF. The transmit filter 35 is connected to the PA 38, and the receive filter 36 is connected to the LNA 39.

Transmission signals input to the transmit terminal Tx are amplified by the PA 38. The transmit filter 35 outputs high-frequency signals in the transmit band to the common terminal Na among the amplified signals, and suppresses signals with other frequencies. The filtered transmission signal passes through the switch 34 and the HPF 31, the BPF 32, or the LPF 33 to be output from the antenna 30.

Reception signals input to the antenna 30 pass through the HPF 31, the BPF 32, or the LPF 33 and the switch 34. The receive filter 36 allows signals in the receive band to pass therethrough among high-frequency signals input to the common terminal Na, and suppresses signals with other frequencies. The filtered reception signal is amplified by the LNA 39, and is then output to the receive terminal Rx. The filter of the first embodiment is used for at least one of the BPF 32, the transmit filter 35, and the receive filter 36, for example. As described above, the filter of the first embodiment can be used in the multiplexer.

Although the embodiments of the present invention have been described in detail, it is to be understood that the various change, substitutions, and alterations could be made hereto without departing from the spirit and scope of the invention.

What is claimed is:

1. A filter comprising:
an input terminal;
an output terminal;
a ground terminal;
a first parallel resonant circuit including a first capacitor and a first line, each of the first capacitor and the first line being shunt-connected to a first node of a series pathway connecting the input terminal and the output terminal;
a second parallel resonant circuit including a second capacitor and a second line, each of the second capacitor and the second line being shunt-connected to a second node of the series pathway, the second node being different from the first node;
a first dielectric layer having a surface on which a first connection line is disposed; and
a second dielectric layer having a surface on which the first line and the second line are disposed, the second dielectric layer being arranged on or above the first dielectric layer and having first, second, third, fourth, fifth, and sixth via wirings that are penetrating through the second dielectric layer, the first via wiring electrically connecting the first line to the series pathway, the second via wiring electrically connecting the first line to the ground terminal, the third via wiring connecting the first line at a position between the first via wiring and the second via wiring to the first connection line at a first position of the first connection line, the fourth via wiring electrically connecting the second line to the series pathway, the fifth via wiring electrically connecting the second line to the ground terminal, the sixth via wiring connecting the second line at a position between the fourth via wiring and the fifth via wiring to the first connection line at a second position of the first connection line different from the first position of the first connection line.

2. The filter according to claim 1, further comprising:
a third capacitor having a first end coupled to the first node and a second end coupled to the second node.

3. The filter according to claim 2, wherein
the first parallel resonant circuit and the second parallel resonant circuit form a passband, and the third capacitor and the first connection line form a stopband.

4. The filter according to claim 1, wherein
the first line and the second line extend in substantially identical directions on the surface of the second dielectric layer.

5. The filter according to claim 4, wherein
the first via wiring and the fourth via wiring are located at a same side with respect to the third via wiring and the sixth via wiring on the surface of the second dielectric layer.

6. The filter according to claim 1, further comprising:
a third parallel resonant circuit including a fourth capacitor and a third line, each of the fourth capacitor and the third line being shunt-connected to a third node of the series pathway, the third node being different from the first node and the second node, wherein
a second connection line is disposed on the surface of the first dielectric layer,
the third line is disposed on the surface of the second dielectric layer,
seventh, eighth, and ninth via wirings penetrate through the second dielectric layer, the seventh via wiring electrically connecting the third line to the series pathway, the eighth via wiring electrically connecting the third line to the ground terminal, the ninth via wiring connecting the third line at a position between the seventh via wiring and the eighth via wiring to the second connection line at a first position of the second connection line, and the sixth via wiring connects to the second connection line at a second position of the second connection line different from the first position of the second connection line.

7. The filter according to claim 1, wherein
the first line and the second line are located 50 μm or greater away from the first connection line in a thickness direction of the second dielectric layer.

8. The filter according to claim 1, further comprising:
a multilayered body including a plurality of dielectric layers that are stacked, wherein
the first dielectric layer and the second dielectric layer are included in the plurality of dielectric layers, and
the input terminal, the output terminal, and the ground terminal are disposed on a surface of the multilayered body.

9. A front end circuit comprising:
an antenna terminal;
a high-pass filter, a low-pass filter, and a bandpass filter that are connected to the antenna terminal; and
a multiplexer to be connected to the high-pass filter, the low-pass filter, or the bandpass filter, the multiplexer including a receive filter and a transmit filter,
wherein at least one of the band-pass filter, the receive filter, and the transmit filter is the filter as set forth in claim 1.

\* \* \* \* \*